Figure 1:
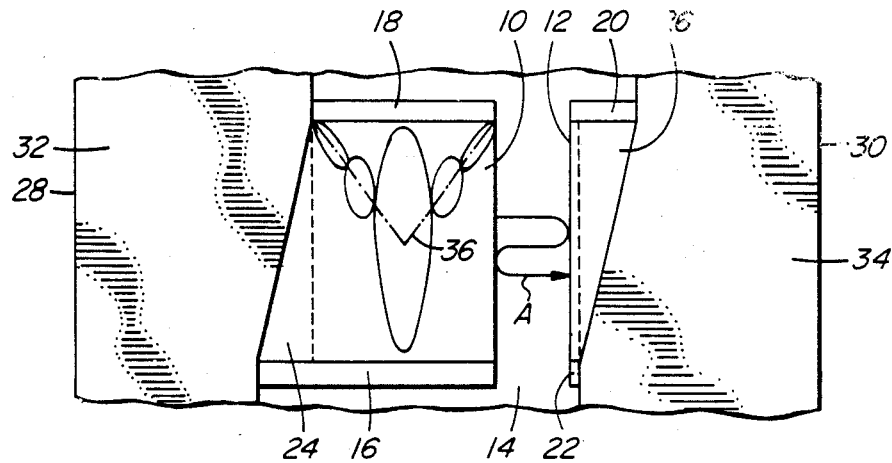

United States Patent [19]

Suthers et al.

[11] Patent Number: 4,814,658

[45] Date of Patent: Mar. 21, 1989

[54] SAW DEVICE WITH CONTINUOUS FINGER PATTERN

[75] Inventors: Mark S. Suthers, Lanark; Grantley O. Este, Stittsville; Richard W. Streater, Nepean; Blair K. MacLaurin, Dunrobin, all of Canada

[73] Assignee: Northern Telecom Limited, Montreal, Canada

[21] Appl. No.: 119,455

[22] Filed: Nov. 10, 1987

Related U.S. Application Data

[63] Continuation-in-part of Ser. No. 936,525, Dec. 1, 1986.

[30] Foreign Application Priority Data

Nov. 10, 1986 [CA] Canada .................................... 522629

[51] Int. Cl.[4] ............................................ H01L 41/08
[52] U.S. Cl. ............................ 310/313 D; 310/313 C; 333/154; 333/194
[58] Field of Search ........... 310/313 B, 313 C, 313 D; 333/150–155, 193–196

[56] References Cited

U.S. PATENT DOCUMENTS

| | | | |
|---|---|---|---|
| 4,144,508 | 3/1979 | Lewis et al. | 310/313 C |
| 4,333,065 | 6/1982 | De Vries | 310/313 C |
| 4,417,221 | 11/1983 | Hunsinger | 310/313 D |
| 4,486,724 | 12/1984 | Schofield | 333/154 |
| 4,567,453 | 1/1986 | Schofield | 333/194 |
| 4,642,507 | 2/1987 | Suthers et al. | 310/313 B |
| 4,663,554 | 5/1987 | Schofield | 310/313 D |
| 4,673,901 | 6/1987 | Ehrmann-Falkenau et al. | 310/313 C |

FOREIGN PATENT DOCUMENTS

56-122215  9/1981  Japan .

*Primary Examiner*—Mark O. Budd
*Attorney, Agent, or Firm*—R. John Haley

[57] ABSTRACT

A SAW device includes aligned IDTs (inter-digital transducers) with a continuous pattern of fingers between their front edges. Each IDT may be symmetrical about its center, and includes front and back edge reflection suppressing regions of fingers of successively decreasing length, which serve to suppress surface acoustic wave reflections at the respective edges. Optional shield regions between the two front edge suppressing regions, and between the back edge suppressing regions and acoustic absorbers, include fingers of successively increasing length complementary to and adjacent the fingers of successively decreasing length of the reflection suppressing regions. The IDTs may be apodized or unapodized, and each IDT may include dummy fingers between its active region and each reflection suppressing region.

12 Claims, 3 Drawing Sheets

SAW DEVICE WITH CONTINUOUS FINGER PATTERN

This is a continuation-in-part of our U.S. patent application Ser. No. 936,525 filed Dec. 1, 1986, now abandoned.

This invention relates to SAW (surface acoustic wave) devices.

It is well known to provide a SAW device for use as a bandpass filter. Generally, such a SAW device comprises two IDTs (inter-digital transducers) which are spaced from and aligned with one another on the surface of a substrate of a suitable piezoelectric material, such as lithium niobate (LiNbO$_3$), for the propagation of surface acoustic waves therebetween. Typically one of the IDTs is an apodized IDT, in which the fingers of the IDT overlap along their lengths by differing amounts at different positions along the IDT, which is driven with a signal to be filtered and constitutes an input transducer, and the filtered signal is derived from the other IDT which constitutes an output transducer.

Various measures are known or have been proposed for suppressing undesired acoustic waves in SAW devices and thereby improving their performance. In particular, it is known to provide an acoustic absorber between each IDT and the adjacent end of the substrate in order to suppress acoustic wave reflections from this end. Este et al. U.S. Pat. No. 4,684,841, issued Aug. 4, 1987 and entitled "SAW Devices Including Resistive Films" describes a SAW device in which the acoustic absorber is constituted by a thin resistive doped silicon film. In addition, Suthers et al. U.S. Pat. No. 4,642,507 issued Feb. 10, 1987 and entitled "SAW Devices with Reflection Suppressing Fingers" describes a SAW device in which tapered dummy fingers are provided at the back edge of each IDT in order to suppress acoustic wave reflections from this back edge. The front edge of the acoustic absorber film is tapered in a complementary manner to avoid reflections from this.

It has also been found that capacitive coupling of the driven fingers at one or both ends of an apodized IDT to a ground plane, which is normally directly under the substrate in order to reduce electromagnetic feedthrough, can detract from the performance of the SAW device. This problem can be avoided by making the axis of the apodization pattern have a V-shape, so that there are short driven fingers at both ends of the apodized IDT, as described in Suthers et al. U.S. patent application Ser. No. 839,657 filed Mar. 14, 1986 and entitled "SAW Device with Apodized IDT".

Whilst these measures considerably enhance the performance of SAW devices, and enable spurious time domain signals to be reduced to better than 50 dB below the main, desired, signal, at least one further unwanted signal can be identified. An object of this invention, therefore, is to provide an improved SAW device in which this further unwanted signal is reduced or suppressed.

According to one aspect of this invention there is provided a SAW (surface acoustic wave) device comprising a substrate having two IDTs (inter-digital transducers) thereon aligned for propagation of a surface acoustic wave with a predetermined wavelength lambda between front edges of the IDTs, each of the IDTs including a reflection suppressing region at its front edge, the reflection suppressing region comprising a plurality of spaced electrically interconnected fingers of successively decreasing length, the reflection suppressing regions forming at least part of a continuous pattern of fingers spaced with a pitch of lambda/4 between the front edges of the IDTs.

The reflection suppressing regions at the front edges of the IDTs suppress surface acoustic wave reflections at these front edges, whereby a spurious surface acoustic wave which is otherwise reflected once at the front edge of each IDT is substantially eliminated. The continuous pattern of fingers avoids discontinuities in the path of the surface acoustic wave.

In an embodiment of the invention the continuous pattern includes a shield region between the reflection suppressing regions at the front edges of the IDT's, the shield region comprising a plurality of electrically interconnected fingers for connection to a ground point. The shield region conveniently includes fingers of successively increasing length complementary to and adjacent the fingers of successively decreasing length of the reflection suppressing region at the front edge of each IDT.

In another embodiment of the invention the fingers of the reflection suppressing regions are complementary to and adjacent one another, thereby forming an inclined junction between the reflection suppressing regions.

Advantageously each IDT includes a reflection suppressing region, comprising a plurality of spaced electrically interconnected fingers of successively decreasing length, at a back edge of the IDT. The SAW device may further comprise two further shield regions, each comprising a plurality of electrically interconnected fingers for connection to a ground point, each adjacent to the reflection suppressing region at the back edge of a respective one of the IDTs, each further shield region including fingers of successively increasing length complementary to and adjacent the fingers of successively decreasing length of the respective reflection suppressing region at the back edge of the respective IDT.

According to another aspect of this invention there is provided a SAW (surface acoustic wave) device comprising a substrate having an IDT (inter-digital transducer) on a surface thereof, the IDT comprising: an active region of inter-digital fingers, for transducing a surface acoustic wave with a predetermined wavelength for propagation on said surface via a front edge of the IDT; a front edge reflection suppressing region, comprising a plurality of spaced electrically interconnected fingers of successively decreasing length, at the front edge of the IDT; and a back edge reflection suppressing region, comprising a plurality of spaced electrically interconnected fingers of successively decreasing length, at a back edge of the IDT opposite the front edge; fingers in the reflection suppressing regions being spaced, in the direction of propagation of the surface acoustic wave, with a pitch of one quarter of said predetermined wavelength.

The IDT may be an apodized IDT, and may include a plurality of dummy fingers between the active region and each reflection suppressing region, the fingers of the reflection suppressing regions and the dummy fingers all being electrically interconnected and spaced with the same pitch.

In order to provide effective reflection suppression, each of the reflection suppressing regions preferably comprises at least about 40 fingers, and may comprise an even larger number of, e.g. about 100, fingers.

The invention also provides a SAW (surface acoustic wave) device comprising a substrate having two IDTs (inter-digital transducers) thereon aligned for propagation of a surface acoustic wave having a predetermined wavelength lambda between front edges of the IDTs, the SAW device further comprising a continuous pattern of fingers spaced with a pitch of lambda/4 between the front edges of the IDTs, at least one inclined junction between two different regions of the SAW device being formed by fingers of successively increasing length complementary to and adjacent fingers of successively decreasing length extending from respective conductive rails at opposite sides of the IDTs.

Figure 2:
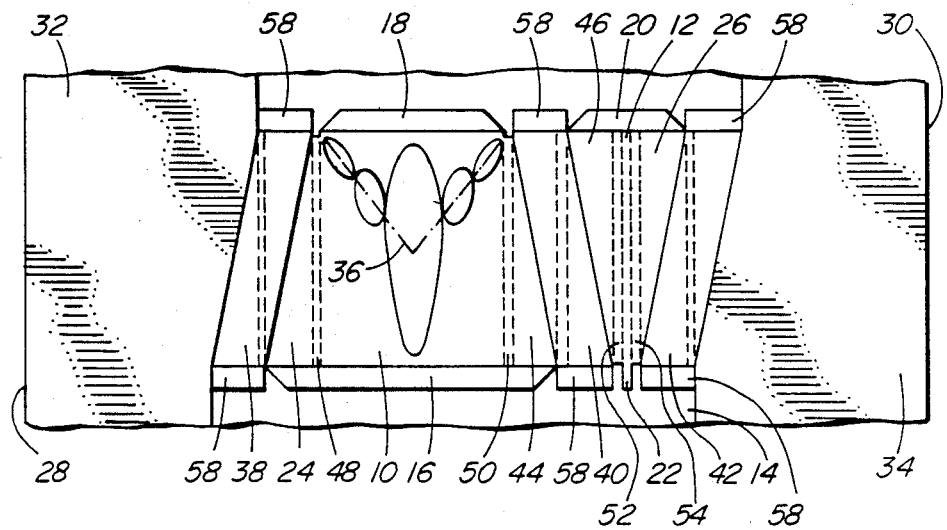
Figure 3:
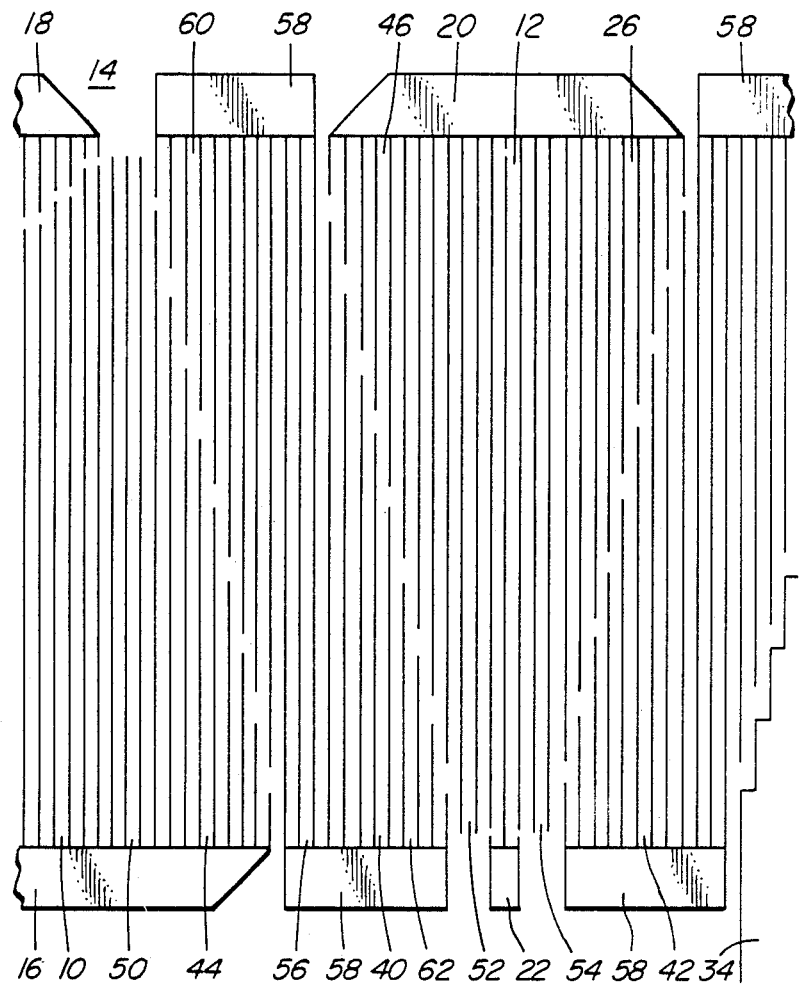

The invention will be further understood from the following description with reference to the accompanying drawings, in which similar references are used in the different figures to denote similar parts and in which:

FIG. 1 schematically illustrates a SAW device in accordance with principles known in the prior art and the patent applications already referred to;

FIG. 2 schematically illustrates a SAW device in accordance with an embodiment of this invention;

FIG. 3 is an enlarged illustration of part of the SAW device of FIG. 2; and

Figure 4:
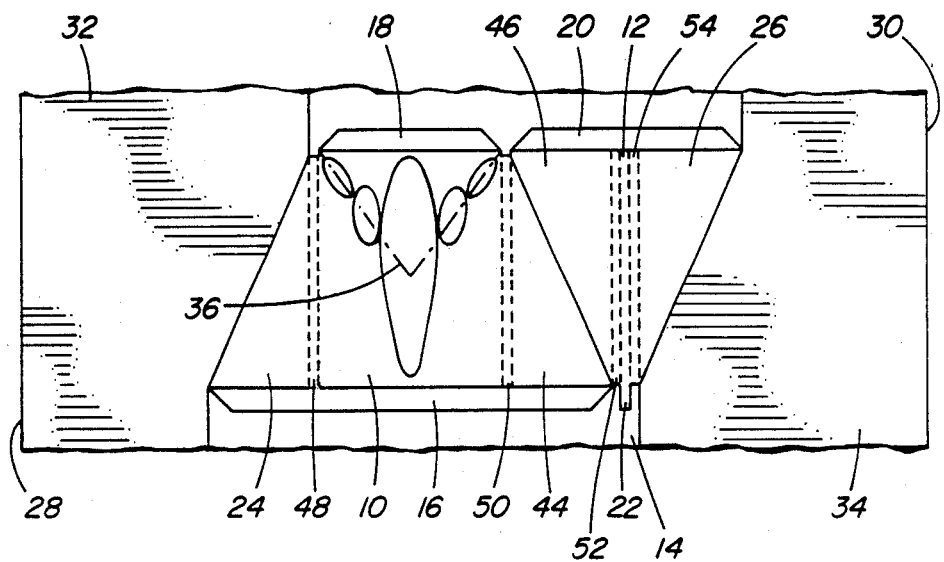

FIG. 4 schematically illustrates a SAW device in accordance with another embodiment of the invention.

Referring to FIG. 1, a SAW device comprises an apodized input IDT 10 and an unapodized output IDT 12 which are spaced apart and aligned with one another, for propagation of surface acoustic waves, on a surface of a piezoelectric substrate 14, for example of lithium niobate. Each transducer comprises a plurality of overlapping interdigital fingers (not shown individually) which are connected to conductive rails 16, 18, 20, and 22. One rail 16, 20 of each IDT is grounded, the other rail 18 of the IDT 10 constituting an input and the other rail 22 of the IDT 12 constituting an output of the SAW device.

In order to suppress surface acoustic wave reflections from the back edge of each IDT 10, 12, each IDT includes at its back edge a plurality of, for example 40 to 100, dummy fingers of successively decreasing length and all connected to the grounded conductive rail 16, 20 of the respective IDT 10, 12, forming a reflection suppressing region 24, 26 respectively in the manner described in U.S. Pat. No. 4,642,507 already referred to.

In addition, surface acoustic wave reflections from the adjacent end edges 28, 30 of the substrate 14 are suppressed by acoustic absorbers 32, 34 respectively extending between these end edges 28, 30 and the tapering back edges of the reflection suppressing regions 24, 26 respectively. The absorbers 32, 34 have correspondingly tapering front edges, and are each constituted by a thin resistive film of doped silicon having a resistivity of about 1 megohm/square, as described in U.S. Pat. No. 4,684,841 already referred to.

In order to reduce capacitive coupling, to a ground plane or grounded case directly beneath the substrate 14, of driven fingers, which are connected to the conductive rail 18, of the apodized IDT 10 especially at the front and back edges of this IDT, as illustrated schematically the apodization pattern of this IDT has an axis 36 which has a V-shape as described in U.S. patent application Ser. No. 839,657 already referred to.

A SAW device as illustrated in FIG. 1 can be constructed so that spurious time domain signals are more than 50 dB below the main signal. It has been found, however, that these spurious signals still include an identifiable signal at about 56 dB below the main signal, which can be suppressed as described below to achieve a particularly high performance SAW device, this being particularly advantageous for SAW devices to be used in digital radio transmission systems. From the timing of this identifiable spurious signal relative to that of the main signal, it can be determined that this spurious signal is due to surface acoustic waves being reflected once at the front edge of each IDT and hence having a triple transit between the IDTs, as shown by an arrow A in FIG. 1.

Referring now to FIG. 2, a SAW device in accordance with an embodiment of this invention is illustrated with the same elements 10 to 36 referenced as in FIG. 1. In addition, the SAW device of FIG. 2 includes three shield regions 38, 40, and 42, two additional reflection suppressing regions 44 and 46, and four dummy finger regions 48, 50, 52, and 54. These regions are described in detail below, with additional reference to FIG. 3 which illustrates, in greatly simplified form but in greater detail than FIG. 2, parts of the SAW device of FIG. 2. Broken lines are used in FIG. 2 to illustrate the extents of the various regions for convenience of description and to aid in providing a full understanding of the invention.

The reflection suppressing region 44 is provided at the front edge of the IDT 10 in the same manner and, in this example, with the same design as the reflection suppressing region 24, so that the IDT 10 is symmetrical about its center. As is illustrated in FIG. 3, the reflection suppressing region 44 consists of a plurality of fingers of successively decreasing length, spaced apart with a pitch of one quarter wavelength and all electrically connected to the grounded conductive rail 16. The spacing of the fingers results in reflections at successive fingers being out of phase whereby they substantially cancel one another.

The reflection suppressing region 46, also shown in FIG. 3, is similarly provided at the front edge of the IDT 12, in the same manner as the reflection suppressing region 26 at the back edge of this IDT, so that the IDT 12 is also symmetrical about its center. As both reflection suppressing regions 44 and 46 have the same taper, the phase fronts of propagated surface acoustic waves remain planar. As these regions substantially cancel reflections at the front edges of the IDTs, the triple transit spurious signal discussed above is substantially eliminated.

The shield region 40 comprises a region 56 having a plurality of fingers connected at both ends to conductive rails 58 which are connected to the case or ground plane of the SAW device. On each side of the region 56 the shield region 40 comprises a region 60 or 62 of fingers tapering in a manner complementary to the taper of the adjacent reflection suppressing region 44 or 46 respectively, these fingers being connected to only one of the rails 58. The other shield regions 38 and 42 are similar, being disposed between the respective reflection suppressing region 24 or 26 and the respective acoustic absorber 32 or 34. FIG. 3 illustrates the manner in which the front edge of the absorber 34 is stepped to complement the taper of the adjacent fingers.

The conductive rails 58 of all of the shield regions are connected to the case or ground plane of the SAW device. In order to reduce electromagnetic feedthrough of signals from the input to the output of the SAW device, separate signal ground connections are desirably used for connections to the rails 16 and 20. The grounded shield regions are, as best illustrated in FIG.

2, arranged symmetrically at each end of each IDT, so as to facilitate symmetrical excitation of the IDTs.

For clarity and simplicity, FIG. 3 illustrates only a few of the fingers in the respective regions. In practice, in each of the reflection suppressing regions such as 44, 46, and 26 there will be a relatively large number of fingers, for example 40 to 100 or more, extending over a distance, in the direction of propagation of surface acoustic waves between the transducers, of 10 to 25 or more wavelengths. The complementary parts of the shield regions 40, namely regions 60 and 62, would have corresponding numbers of fingers, all of the fingers being spaced with the same pitch of a quarter wavelength.

The dummy finger regions 48, 50, 52, and 54 each comprise a plurality of, for example five, dummy fingers which are connected to the ground rail 16 or 20 of the respective IDT 10 or 12 and are positioned between the active region of the respective IDT and a respective reflection suppressing region 24, 44, 26, or 46. These dummy finger regions ensure that there is no coupling to the grounded shield regions; such coupling might otherwise occur due to the signal ground potentials of the rails 16 and 20 being different from the case ground potential of the SAW device.

As represented in FIG. 3, the fingers in the various regions of the SAW device all have a constant pitch of one quarter wavelength (this being provided in the active regions of the IDTs 10 and 12 by the use in known manner of finger pairs in these regions). Thus a constant propagation medium is provided throughout the SAW device for the propagation of surface acoustic waves. Furthermore, reflection suppressing tapers are used at each transistion between different regions of the SAW device, and hence at each edge of each shield region 38, 40, or 42, whereby undesired acoustic wave reflections are substantially completely eliminated.

As can be appreciated from FIG. 3, the complementary and adjacent fingers of respectively successively increasing and decreasing lengths extending from the respective conductive rails at opposite sides of the IDTs form inclined junctions between different regions of the IDTs and shield regions. Thus, for example, there is an inclined junction between the reflection suppressing region 44 and the shield region 40, formed by the successively decreasing lengths of the fingers of the region 44 and the complementary and adjacent fingers 60, with successively increasing lengths (considering the drawing from left to right), the fingers extending from the rails 16 and 58 respectively at opposite sides of the IDT. Similar inclined junctions, each of which extends across the full aperture of the IDTs, are illustrated in FIG. 3 on each side of the IDT 12. At each such junction, the continuous pattern of fingers with their quarter wavelength pitch, and the inclination of the junction, substantially eliminate any reflections or discontinuities in the SAW propagation path.

The constant propagation medium is clearly seen from FIG. 3. Throughout the surface acoustic wave path from the input transducer 10 to the output transducer 12 there is a continuing repetition of fingers with a quarter wavelength pitch, transitions between different regions occurring only at the tapered, reflection suppressing, boundaries. As shown clearly in FIG. 3 all of the fingers are straight and parallel, with only their lengths varying to provide the desired SAW characteristics, whereby SAW reflections due to discontinuities within and between the transducers 10 and 12 are substantially eliminated.

FIG. 4 illustrates an alternative embodiment of the invention, which is similar to that of FIGS. 2 and 3 except that the shield regions 38, 40, and 42 and their rails 58 are dispensed with, the reflection suppressing tapers being made more gradual whereby the distance between the transducers 10 and 12 is unchanged. Similar references to those in the preceding figures are used in FIG. 4.

In the embodiment of the invention illustrated in FIG. 4, the reflection suppressing regions 44 and 46 have complementary tapers, whereby these two regions, with the adjacent dummy finger regions 50 and 52, provide an uninterrupted pattern of fingers throughout the area between the transducers 10 and 12. The transition between the regions 44 and 46 has the same form as that shown for each of the tapered transitions in FIG. 3. Thus again in this embodiment of the invention the continuing repetition of fingers with a quarter wavelength pitch throughout the SAW device eliminates reflections, such as the triple transit reflection path shown in FIG. 1, to provide a significant enhancement of the SAW device characteristics.

Although in the embodiments of the invention described above the transducers 10 and 12 have been described as being symmetrical about their centers, this need not necessarily be the case. For example, it should be understood that the advantages of the invention may similarly be provided with transducers whose front edges are tapered and arranged as illustrated in FIG. 4 and whose back edges are tapered and arranged as illustrated in FIGS. 2 and 3, with or without the shield regions 38 and 42.

Numerous other modifications, variations, and adaptations may be made to the embodiments of the invention described above without departing from the scope of the invention as defined in the claims.

What is claimed is:

1. A SAW (surface acoustic wave) device comprising a substrate having two IDTs (inter-digital transducers) thereon aligned for propagation of a surface acoustic wave with a predetermined wavelength lambda between front edges of the IDTs, and a continuous pattern of fingers spaced with a pitch of lambda/4 between the front edges of the IDTs, each of the IDTs including a reflection suppressing region at its front edge, each reflection suppressing region comprising a plurality of spaced electrically interconnected fingers of successively decreasing length, the reflection suppressing regions forming at least part of said continuous pattern of fingers.

2. A SAW device as claimed in claim 1 wherein the continuous pattern of fingers includes a shield region between the reflection suppressing regions at the front edges of the IDTs, the shield region comprising a plurality of electrically interconnected fingers for connection to a ground point.

3. A SAW device as claimed in claim 2 wherein the shield region includes fingers of successively increasing length complementary to and adjacent the fingers of successively decreasing length of the reflection suppressing region at the front edge of each IDT.

4. A SAW device as claimed in claim 1 wherein the fingers of the reflection suppressing regions are complementary to and adjacent one another, thereby forming an inclined junction between the reflection suppressing regions.

5. A SAW device as claimed in claim 4 wherein each IDT includes an active region and a plurality of dummy fingers between the active region and the reflection suppressing region at the front edge of the IDT, the dummy fingers being electrically connected to and being spaced with the same pitch as the fingers of the reflection suppressing region of the IDT.

6. A SAW device as claimed in claim 1 wherein each IDT includes a reflection suppressing region, comprising a plurality of spaced electrically interconnected fingers of successively decreasing length, at a back edge of the IDT.

7. A SAW device as claimed in claim 6 wherein each reflection suppressing region comprises at least about 40 fingers.

8. A SAW device as claimed in claim 3 wherein each IDT includes a reflection suppressing region, comprising a plurality of spaced electrically interconnected fingers of successively decreasing length, at a back edge of the IDT, the SAW device further comprising two further shield regions, each comprising a plurality of electrically interconnected fingers for connection to a ground point, each adjacent to the reflection suppressing region at the back edge of a respective one of the IDTs, each further shield region including fingers of successively increasing length complementary to and adjacent the fingers of successively decreasing length of the respective reflection suppressing region at the back edge of the respective IDT.

9. A SAW (surface acoustic wave) device comprising a substrate having an IDT (inter-digital transducer) on a surface thereof, the IDT comprising:

an active region of inter-digital fingers, for transducing a surface acoustic wave with a predetermined wavelength for propagation on said surface via a front edge of the IDT;

a front edge reflection suppressing region, comprising a plurality of spaced electrically interconnected fingers of successively decreasing length, at the front edge of the IDT;

a back edge reflection suppressing region, comprising a plurality of spaced electrically interconnected fingers of successively decreasing length, at a back edge of the IDT opposite the front edge; and a plurality of dummy fingers between the active region and each reflection suppressing region;

the fingers in the reflection suppressing regions and the dummy fingers all being electrically interconnected and spaced, in the direction of propagation of the surface acoustic wave, with a pitch of one quarter of said predetermined wavelength.

10. A SAW device as claimed in claim 9 wherein each reflection suppressing region comprises at least about 40 fingers.

11. A SAW device as claimed in claim 10 wherein the IDT is an apodized IDT.

12. A SAW (surface acoustic wave) device comprising a substrate having two IDTs (inter-digital transducers) thereon aligned for propagation of a surface acoustic wave having a predetermined wavelength lambda between front edges of the IDTs, the SAW device further comprising a continuous pattern of fingers spaced with a pitch of lambda/4 between the front edges of the IDTs, at least one inclined junction between two different regions of the SAW device being formed by fingers of successively increasing length complementary to and adjacent fingers of successively decreasing length extending from respective conductive rails at opposite sides of the IDTs.

* * * * *